United States Patent [19]

Okuyama

[11] Patent Number: 5,212,482

[45] Date of Patent: May 18, 1993

[54] DIGITAL-TO-ANALOG CONVERTER HAVING AN EXTERNALLY SELECTABLE OUTPUT VOLTAGE RANGE

[75] Inventor: Tetsuo Okuyama, Kasugai, Japan

[73] Assignees: Fujitsu Limited, Kanagawa; Fujitsu VLSI Limited, Aichi, both of Japan

[21] Appl. No.: 745,602

[22] Filed: Aug. 16, 1991

[30] Foreign Application Priority Data

Aug. 18, 1990 [JP] Japan ................... 2-217804

[51] Int. Cl.⁵ .............................. H03M 1/18
[52] U.S. Cl. ....................... 341/139; 341/145
[58] Field of Search ............... 341/136, 139, 144, 145, 341/146

[56] References Cited
U.S. PATENT DOCUMENTS 3,997,892 12/1976 Susset .................. 341/136
4,240,070 12/1980 Helbig et al. .......... 341/139
4,338,591 7/1982 Tuthill ................. 341/145
4,491,825 1/1985 Tuthill ................. 341/145
4,543,560 9/1985 Holloway ............... 341/133
4,999,628 3/1991 Kakubo et al. ......... 341/139

Primary Examiner—Marc Hoff
Attorney, Agent, or Firm—Nikaido, Marmelstein, Murray & Oram

[57] ABSTRACT

A D/A converter includes a D/A conversion part for converting a digital input signal into an analog output signal, a parameter setting part for generating a plurality of circuit parameters which define a voltage range of the analog output signal, and a setting control part for selecting desired circuit parameters from the plurality of circuit parameters in accordance with data supplied from an external device, so that the D/A conversion part generates the analog output signal having a voltage based on the desired circuit parameters.

30 Claims, 6 Drawing Sheets

1

DIGITAL-TO-ANALOG CONVERTER HAVING AN EXTERNALLY SELECTABLE OUTPUT VOLTAGE RANGE

BACKGROUND OF THE INVENTION (1) Field of the Invention

The present invention generally relates to digital-to-analog converters, and more particularly to a digital-to-analog converter having variable circuit parameters which determine the voltage range of an analog output signal.

(2) Description of the Prior Art

Digital-to-analog converters (hereafter simply referred to as D/A converters) are widely used in various electronic devices. Conventional D/A converters have fixed circuit parameters which determine the state of the analog output voltages (voltage range), and are thus suitable for very limited or specific applications. For example, the D/A converter converts a digital signal into an analog signal swinging within a voltage range defined by a high-potential-side reference voltage and a low-potential-side reference voltage. Recently, a chip having a plurality of D/A converters has been manufactured. Normally, the high-potential-side and low-potential-side reference voltages are applied in common to the on-chip D/A converters. Thus, the D/A converters have identical analog output voltage ranges. If the high-potential-side and low-potential-side reference voltages are externally varied, the identical analog output voltage ranges of the D/A converters will be changed. However, it is impossible for the on-chip D/A converters to have the different output voltage ranges. It may be possible to provide external terminals for the respective on-chip D/A converters and supply different reference voltages thereto. However, such a possible arrangement would have a larger number of terminals.

As described above, conventionally, it is very difficult or impossible to provide various D/A conversion characteristics of the single D/A converter and provide the mutually different D/A conversion characteristics of the on-chip D/A converters.

SUMMARY OF THE INVENTION

It is a general object of the present invention to provide an improved D/A converter in which the above-mentioned disadvantages are eliminated.

A more specific object of the present invention is to provide a D/A converter having variable circuit parameters which define the voltage range of the analog output voltage.

The above-mentioned objects of the present invention are achieved by a D/A converter comprising: D/A conversion device for converting a digital input signal into an analog output signal; parameter setting device, coupled to the D/A conversion device, for generating a plurality of circuit parameters which define a voltage of the analog output signal; and setting control device, coupled to the parameter setting device, for selecting desired circuit parameters from the plurality of circuit parameters in accordance with data supplied from an external device, so that the D/A conversion device generates the analog output signal having a voltage range based on the desired circuit parameters.

Another object of the present invention is to provide a D/A converter device including a plurality of D/A converters, each being configured as described above.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Figure 1:
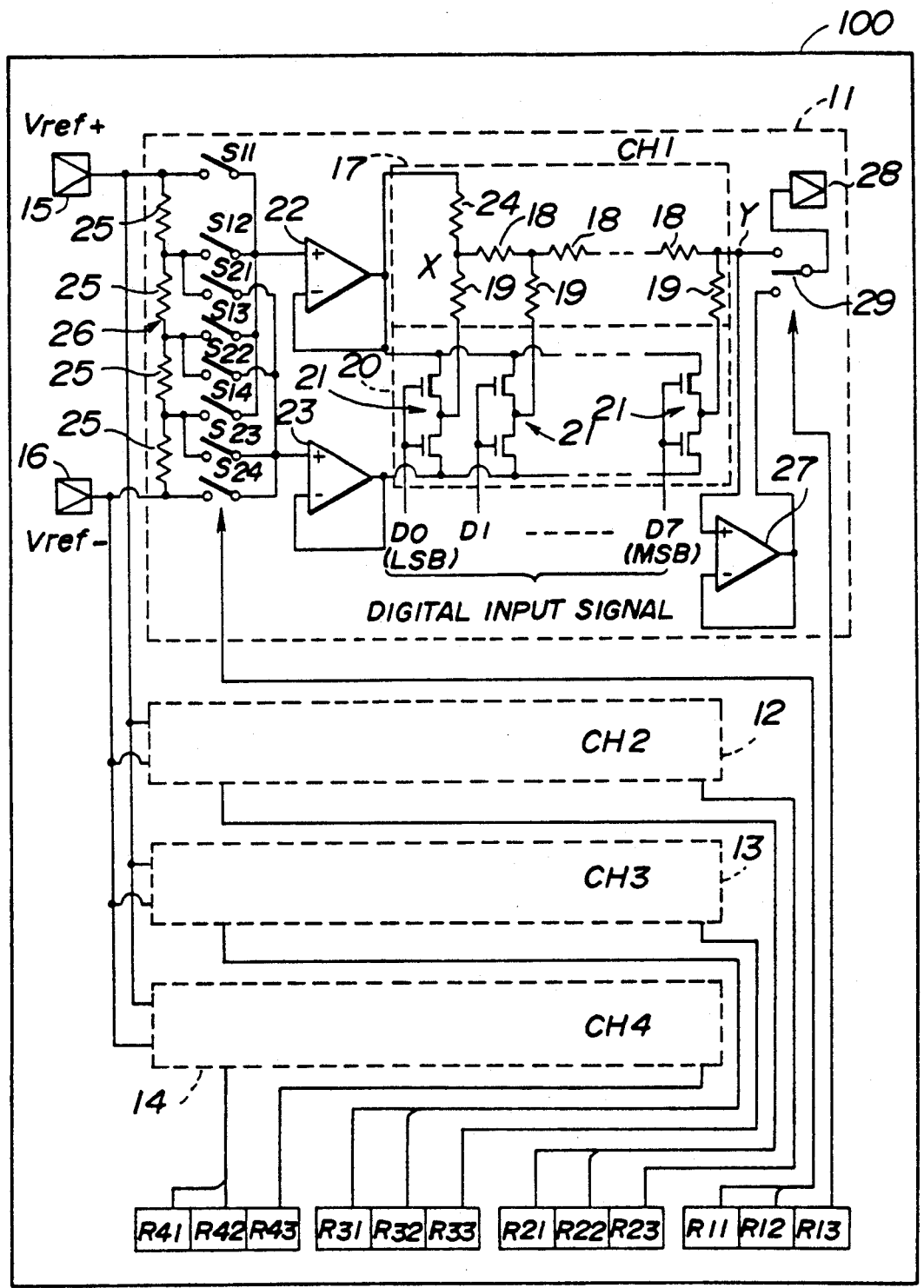
FIG. 1 is a block diagram of a first preferred embodiment of the present invention.

A description will now be given of a first embodiment of the present invention with reference to FIG. 1. Four D/A converters 11, 12, 13 and 14 (channels CH1-CH4) are formed on a chip 100. The D/A converters 11-14 have identical structures, and thus just the D/A converter 11 will be described in detail below.

A high-potential-side reference voltage Vref+ is applied to a terminal 15, which is provided in common to the D/A converters 11-14. Similarly, a low-potential-side reference voltage Vref— is applied to a terminal 16, which is provided in common to the D/A converters 11-14.

The D/A converter 11, which is an eight-bit D/A converter, has an R-2R ladder type resistor network circuit 17. As shown, the resistor network circuit 17 includes seven resistors 18, each having a resistance R, and eight weighting resistors 19, each having a resistance 2R. Further, the D/A converter 11 has a select circuit 20, which is made up of eight switch circuits 21. Each of the switch circuits 21 is made up of a P-channel MOS transistor and an N-channel MOS transistor. The drains of a pair of MOS transistors are connected to one end of the corresponding resistor 19, which has the other end connected to a node where two adjacent resistors 18 are connected in series.

The gates of a pair of MOS transistors are mutually connected, and supplied with a corresponding bit of a digital input signal, which consists of bits D0 (LSB) through D7 (MSB). The sources of the eight P-channel MOS transistors of the switch circuits 21 are connected to an inverting input terminal and output terminal of a voltage-follower type operational amplifier 22. The drains of the eight N-channel MOS transistors of the switch circuits 21 are connected to an inverting input terminal and output terminal of a voltage-follower type operational amplifier 23. Either the P-channel MOS transistor or the N-channel MOS transistor is turned ON in accordance with the value of the corresponding bit of the digital input signal. For example, when D0=0 (low level), the P-channel MOS transistor of the corresponding switch circuit 21 is turned ON, so that the related resistor 19 is coupled to the operational amplifier 22 via the above P-channel MOS transistor. Meanwhile, when D0=1 (high level), the N-channel MOS transistor of the corresponding switch circuit 21 is turned ON, so that the related resistor 19 is coupled to the operational amplifier 23 via the above N-channel MOS transistor.

The resistor network circuit 17 has a resistor 24, which is connected to the output terminal of the operational amplifier 22 and a node X where the resistors 18 and 19 related to the bit (LSB) D0 are connected.

The D/A converter 17 includes a voltage dividing ladder type resistor network circuit 26, which is connected between the terminals 15 and 16. The resistor network circuit 26 has four resistors 25 connected between the terminals 15 and 16 in series. Eight analog switches S11, S12, S13, S14, S21, S22, S23 and S24 are connected to the resistors 25 so that a variable high-potential-side reference voltage is applied to a non-inverting input terminal of the operational amplifier 22 and a variable low-potential-side reference voltage is applied to a non-inverting input terminal of the operational amplifier 23.

It is possible to vary the output voltage range of the resistor network circuit 17 by closing only one of the analog switches S11–S14 and closing only one of the analog switches S21–S24. An upper limit voltage of the analog output signal generated by the operational amplifier 22 and applied to the resistor network circuit 17 is determined depending on the voltage of the non-inverting input terminal of the operational amplifier 22. Similarly, a lower limit voltage of the analog output signal generated by the operational amplifier 23 and applied to the resistor network circuit 17 is determined depending on the voltage of the non-inverting input terminal of the operational amplifier 23.

Two two-bit registers R11 and R12 are provided in connection with the group of the analog switches S11–S14 and the group of analog switches S21–S24, respectively. Two-bit data registered in the register R11 closes one of the analog switches S11–S14, and two-bit data registered in the register R12 closes one of the analog switches S21–S24.

A voltage-follower type operational amplifier 27 is connected between a switch 29 and a node Y where the resistor 18 and the weighting resistor 19 related to the bit D7 of the digital input signal are connected. More specifically, a non-inverting input terminal of the operational amplifier 27 is connected to the node Y, and an inverting input terminal and output terminal thereof are connected to the switch 29. The switch 29 selects either the node Y or the output terminal of the operational amplifier 27 in accordance with a one-bit select signal registered in a one-bit register R13. When the switch 29 switches to the node Y, the analog output signal is directly applied to an output terminal 28. Meanwhile, when the switch 29 switches to the operational amplifier 27, the analog output signal passes through the operational amplifier 27, and is then applied to the output terminal 28. The switch 29 is controlled based on the input impedance of a next-stage circuit connected to the output terminal 28.

As shown in FIG. 1, registers R21, R22 and R23, which correspond to the registers R11, R12, and 13, respectively, are provided for the D/A converter 12. Similarly, registers R31, R32 and R33 are provided for the D/A converter 13, and registers R41, R42 and R43 are provided for the D/A converter 14.

Figure 2:
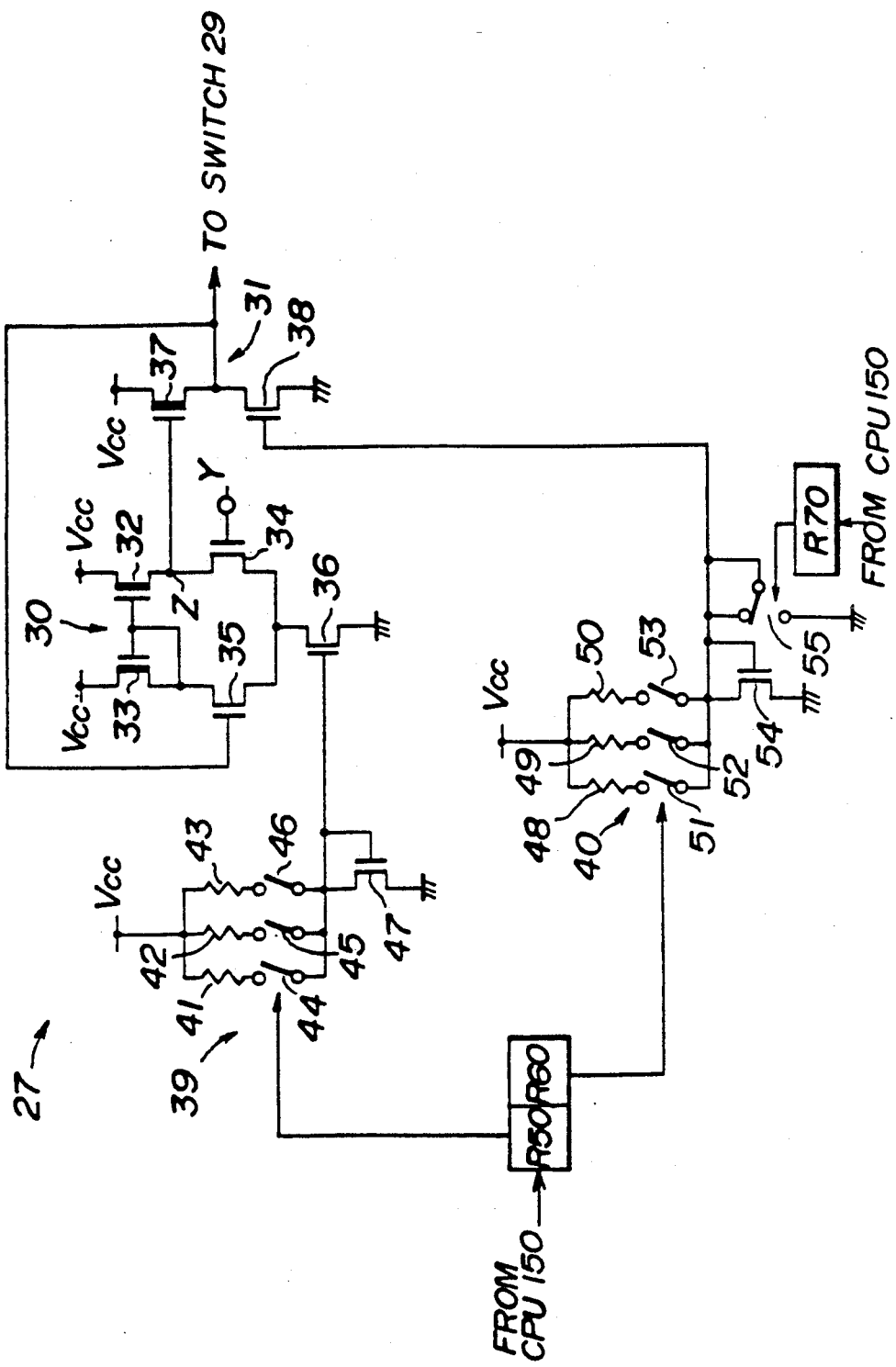
FIG. 2 is a circuit diagram of each voltage-follower type operational amplifier shown in FIG. 1.

FIG. 2 is a circuit diagram of the voltage-follower type operational amplifier 27. As shown in FIG. 2, the operational amplifier 27 includes a differential circuit 30 and an output buffer circuit 31. The differential circuit 30 is composed of P-channel MOS transistors 32 and 33, N-channel MOS transistors 34 and 35, and a constant-current source MOS transistor 36. The sources of the transistors 32 and 33 are connected to a $V_{CC}$ power supply line, and the gates thereof are connected to each other and the drain of the transistor 33. The transistors 32 and 33 form a current-mirror circuit. The drains of the transistors 34 and 35 are connected to the drains of the transistors 32 and 33, respectively. The gate of the transistor 34 is connected to the node Y shown in FIG. 1, and the gate of the transistor 35 is connected to the switch 29 shown in FIG. 1. The sources of the transistors 34 and 35 are connected to the drain of the transistor 36, and the source of the transistor 36 is grounded.

The output buffer circuit 31 is composed of a P-channel MOS transistor 37 and an N-channel MOS transistor 38. The source of the transistor 37 is connected to the $V_{CC}$ power supply line, and the drain thereof is connected to the drain of the transistor 38 having the source which is grounded. The gate of the transistor 37 is connected to a node Z where the drains of the transistors 32 and 34 are connected to each other. The drains of the transistors 37 and 38 are connected to the switch 29 shown in FIG. 1.

The gate terminal of the transistor 36 is connected to a conversion time setting circuit 39, and the gate of the transistor 38 is connected to a current driving ability setting circuit 40.

The conversion time setting circuit 39 is composed of voltage setting resistors 41–43 having mutually different resistances, switches 44–46, and an N-channel MOS transistor 47. The resistors 41–43 are connected to the $V_{CC}$ power supply line and the switches 44–46, respectively. The drain and gate of the transistor 47 are connected to the gate of the transistor 36 and the switches 44–46. The source of the transistor 47 is grounded. One of the switches 44–46 is closed in accordance with a switching signal consisting of two bits registered in a register R50. A change in the gate voltage of the transistor 36 changes the amount of current passing through the differential circuit 30, so that a D/A conversion time necessary to convert the digital input signal into the analog output signal obtained at the terminal 28 can be changed.

The current driving ability setting circuit 40 is composed of resistors 48–50, switches 51–53, and an N-channel MOS transistor 54. These elements of the circuit 40 are connected in the same way as those of the circuit 39. One of the switches 51–53 is closed in accordance with a switching signal consisting of two bits registered in a register R60. A change in the gate voltage of the transistor 38 changes the amount of current passing through the output buffer circuit 31, so that the current driving ability of the operational amplifier 27 can be changed.

A switch 55 is connected between the gate of the transistor 38 and the ground, and controlled by a one-bit switching signal registered in a register R70. During the time the switch 29 shown in FIG. 1 selects the node Y, the switch 55 is closed, so that the operational amplifier 27 is maintained in the inactive state, so that energy consumed in the operational amplifier 27 can be reduced.

Figure 3:
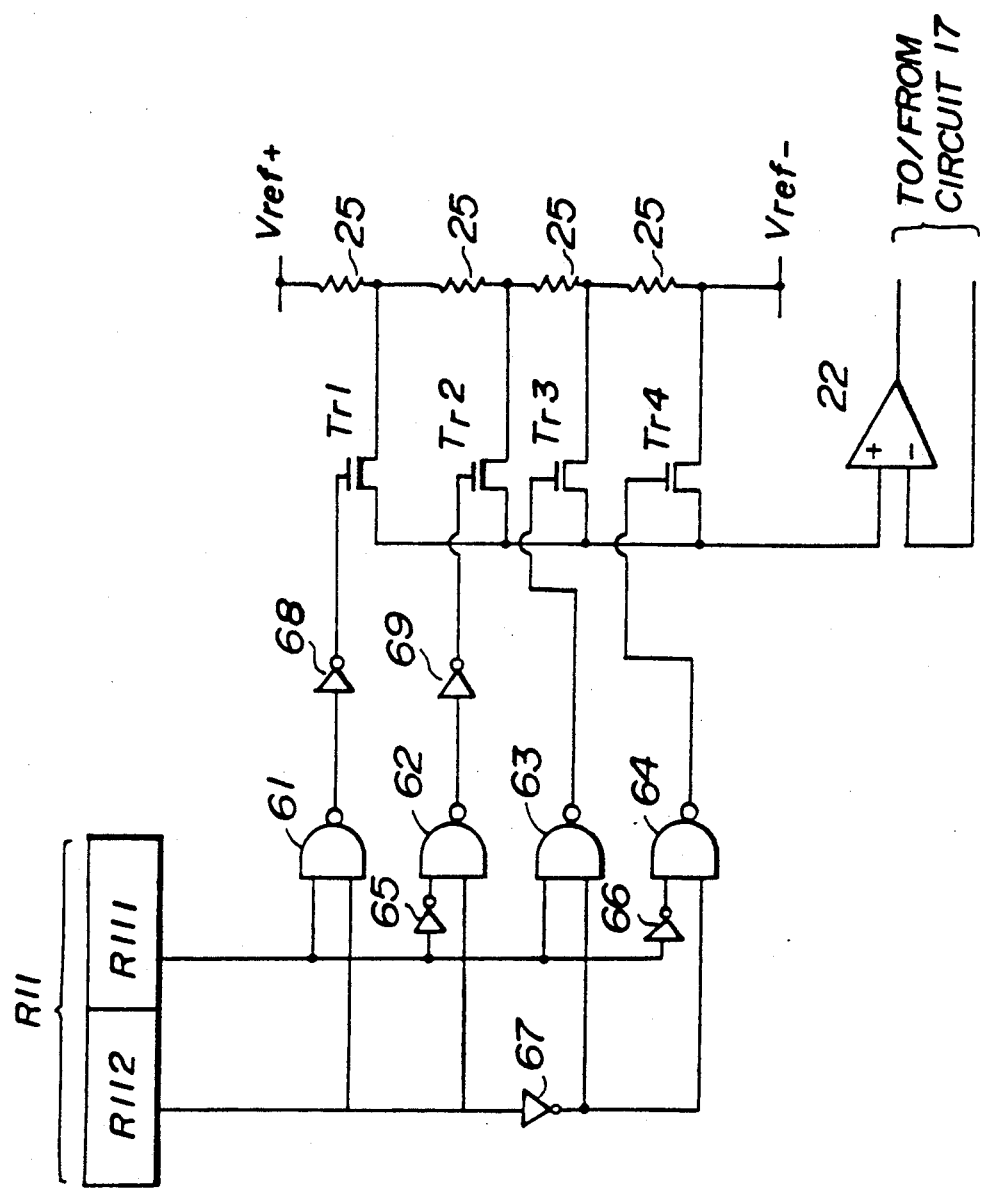
FIG. 3 is a circuit diagram of switches provided on input sides of two operational amplifiers which define voltages applied to a resistor network circuit and a switch circuit.

FIG. 3 is a circuit diagram of the switches S11–S14 shown in FIG. 1. As shown in FIG. 3, the switches S11–S14 are made up of P-channel MOS transistors Tr1 and Tr2, N-channel MOS transistors Tr3 Tr4, NAND gates 61–64, and inverters 65–69. The register R60 is divided into two one-bit register areas R111 and R112. The NAND gates 62–64 and the inverters 65–67 turn ON only one of the transistors Tr1–Tr4.

Figure 4:
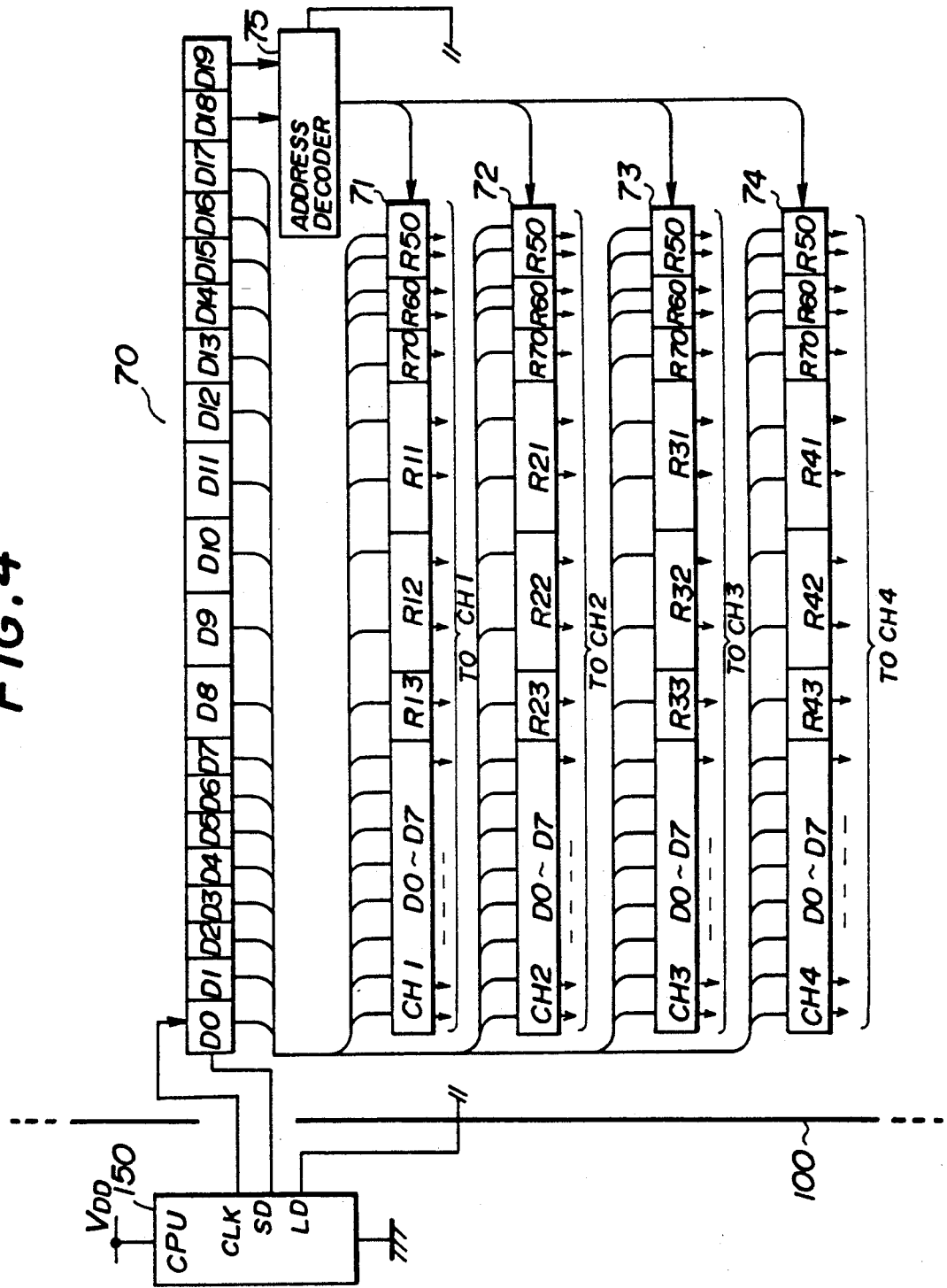
FIG. 4 is a circuit diagram of registers used in the first embodiment of the present invention shown in FIG. 1.

FIG. 4 is a diagram showing groups of registers formed on the chip 100. As shown in FIG. 4, register groups 70–74 are formed on the chip 100. Serial data consisting of bits D0–D19 generated and output by a central processing unit (CPU) 150 is transferred, in serial form, to the register group 70 in synchronism with a shift clock CLK generated thereby, and written therein. Bits D0–D7 are the aforementioned digital input signal which is to be converted into the analog signal. Bit D8 is used for controlling the switch 29 shown in FIG. 1. Bits D9 and D10 are used for selecting one of the switches S21–S24. Bits D11 and D12 are used for selecting one of the switches S11–S14. Bits D13 is used for controlling the switch 55 shown in FIG. 2. Bits D14 and D15 are used for selecting one of the switches 51–53. Bits D16 and D17 are used for selecting one of the switches 44–46. Bits D18 and D19 are used for selecting one of the register groups 71–74. The bits D18 and D19 are input to an address decoder 75, which decodes the bits D18 and D19 in response to a load signal LD generated and output by the CPU 150. When the address decoder 75 decodes the bits D18 and D19 and selects the register group 71, data D0–D7 are written into a corresponding 8-bit register area of the register group 71, the bit D8 is written into the register R13, bits D9 and D10 are written into the aforementioned two-bit register R12 and bits D11 and D12 are written into the aforementioned two-bit register R11. Further, bit D13 is written into the register R70, bits D14 and D15 are written into the register R60, and bits D16 and D17 are written into the register R50.

Figure 5:
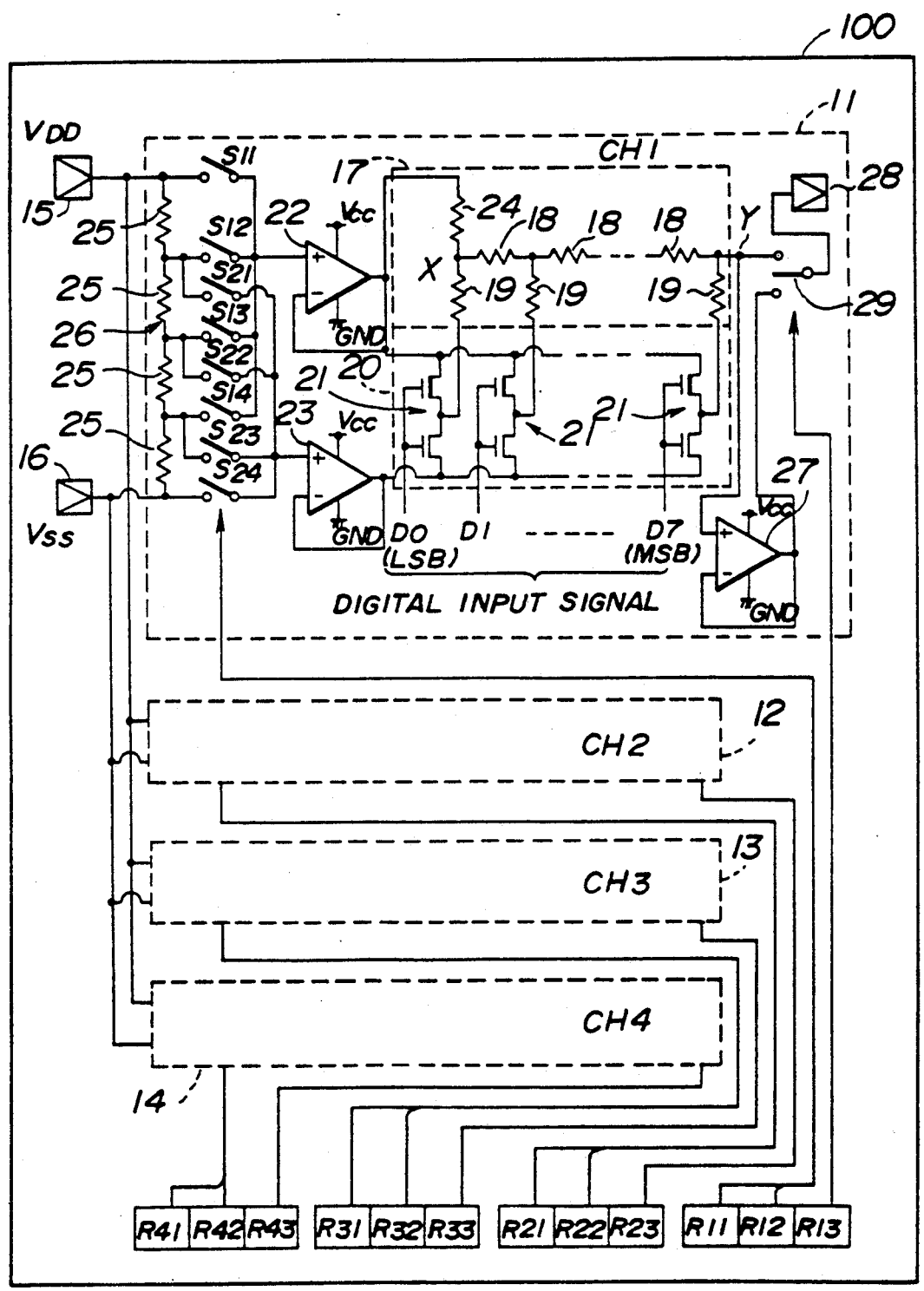
FIG. 5 is a block diagram showing power supply voltages used in the first embodiment of the present invention.

A description will now be given of power supply voltages applied to the chip 100 with reference to FIG. 5. As shown in FIG. 5, four power supply voltages $V_{DD}$, $V_{SS}$, $V_{CC}$ and GND (ground) are used. The power supply voltages $V_{DD}$ and $V_{SS}$ correspond to the aforementioned reference voltages Vref+ and Vref−, respectively. The operational amplifiers 22, 23 and 27 receive the power supply voltages $V_{CC}$ and GND. The bits D0–D7 of the digital input signal assumes a numeral equal to either $V_{CC}$ or GND.

When $V_{DD}=V_{CC}$ and $V_{SS}=$GND, only two power supply voltages are supplied to the chip 100 from an external device. When the chip 100 has four $V_{DD}$, $V_{CC}$, $V_{SS}$ and GND power supply terminals, the $V_{DD}$ and $V_{CC}$ terminals are shortcircuited and the $V_{SS}$ and GND power supply terminals are shortcircuited. The CPU 150 controls the data written into the registers R11 and R12 so that the switches S11–S24 can define a voltage range enabling the select circuit 20 to execute the switching operation. That is, the difference of the output voltages of the operational amplifiers 22 and 23 must be greater than the sum of the threshold voltages of the P-channel and N-channel transistors of each switch circuit 21. The data written into the registers R21, R31, R41, R22, R32, R42 are controlled in the same way as described above.

When $V_{DD}>V_{CC}$ and $V_{SS}<$GND, it is necessary to use the four different power supply voltages. In this case, the CPU 150 controls the data written into the registers R11 and R12 so that $V_{DD}\leq V_{CC}$ and $V_{SS}\geq$GND are satisfied. The data written into the registers R21, R31, R41, R22, R32, R42 are controlled in the same way as described above.

When $V_{DD}<V_{CC}$ and $V_{SS}>$GND, it is necessary to use the four different power supply voltages. In this case, the CPU 150 controls the data written into the registers R11 and R12 so that the switches S11–S24 can define a voltage range enabling the select circuit 20 to execute the switching operation. That is, the difference of the output voltages of the operational amplifiers 22 and 23 must be greater than the sum of the threshold voltages of the P-channel and N-channel transistors of each switch circuit 21. The data written into the registers R21, R31, R41, R22, R32, R42 are controlled in the same way as described above.

When each of the operational amplifiers 22 and 23 is an enhancement type operational amplifier which includes enhancement type transistors, it generates an analog signal having a voltage between $V_{CC}$ and (GND+Vth) while it receives a voltage within $V_{CC}$ and GND within which it has the linear D/A conversion characteristic where Vth is the threshold voltage of the enhancement transistors (which correspond to the transistors 34 and 35 shown in FIG. 2). In this case, a voltage range which is the same as the voltage range defined by the operational amplifiers 22 and 23 is obtained at the node Y, so that the analog output voltage equal to GND cannot be output.

When each of the operational amplifiers 22 and 23 is a depletion type operational amplifier which includes depletion type transistors, it generates an analog signal having a voltage between ($V_{CC}$−Vth) and GND while it receives a voltage within $V_{CC}$ and GND within which it has the linear D/A conversion characteristic. In this case, the analog output voltage equal to $V_{CC}$ cannot be output.

With the above in mind, it is preferable that the operational amplifier 22 be an enhancement type operational amplifier and the operational amplifier 23 be a depletion type operational amplifier. With this arrangement, it is possible to obtain the analog output voltage swinging between $V_{CC}$ and GND.

Figure 6:
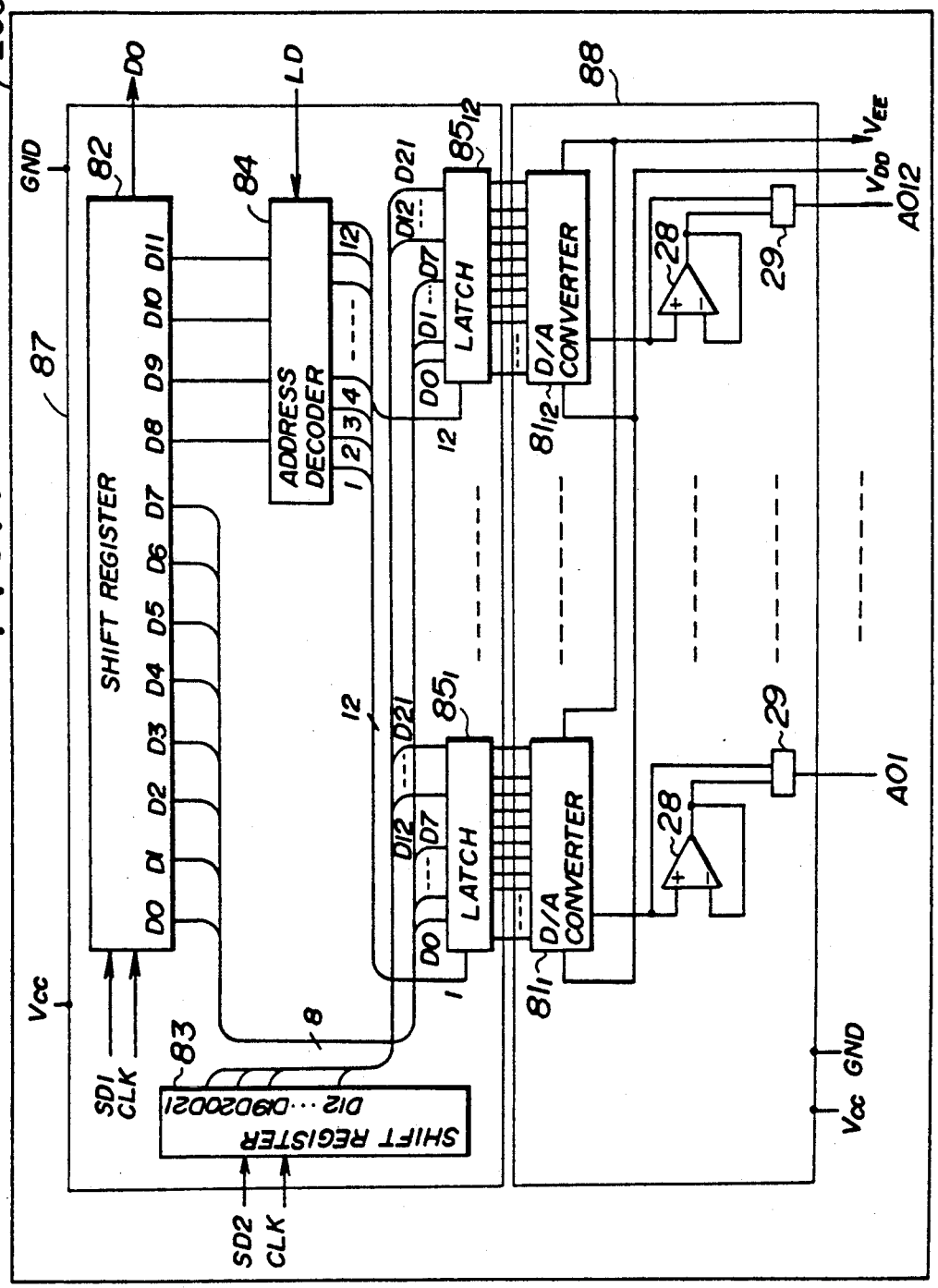
FIG. 6 is a block diagram of a second preferred embodiment of the present invention.

A description will now be given of a second preferred embodiment of the present invention with reference FIG. 6. This figure shows the entire structure of a D/A converter chip 200 on which 12 8-bit D/A converters $81_1$–$81_{12}$ are formed. A 12-bit shift register 82 receives, from the CPU 150, 12-bit serial data SD1 consisting of bits D0–D7 of the digital input signal and four bits D8–D11 for selecting one of the D/A converters $81_1$–$81_{12}$. The bits D0–D7 of the digital input signal are input to 12 18-bit latch circuits $85_1$–$85_{12}$, and then applied to the D/A converters $81_1$–$81_{12}$, respectively. A 10-bit shift register 83 receives from the CPU 150, 10-bit serial data SD2, which consists of bits D12–D21 corresponding to the aforementioned bits D8–D17, respectively. The bits D12–D21 are latched by the latch circuits $85_1$–$85_{12}$ and then applied to the D/A converters $81_1$–$81_{12}$ and the switches 29. For the sake of simplicity, lines connecting the latch circuits $85_1$–$85_{12}$ and switches 29 are omitted. Analog output signals output by the D/A converters $81_1$–$81_{12}$ are input to the respective switches 29, which receive the output signals of the respective operational amplifiers 28. The output signals selected by the switches 29 are labeled A001–A012. $V_{CC}$ and GND lines 87 and 88 run, as shown in FIG. 6. For the sake of simplicity, FIG. 6 is illustrated so that the voltages $V_{CC}$ and GND are transmitted on the same power supply line. The power supply voltages $V_{DD}$ and $V_{EE}$ are applied to the D/A converters $81_1$–$81_{12}$.

It is possible to provide shift registers 82 and 83 for the respective D/A converters 81$_1$-81$_{12}$. In this case, the decoder 84 can be omitted. It is also possible to use shift registers in the same way as the shift registers shown in FIG. 4.

It is possible to replace the R-2R ladder type resistor network circuits 17 by $2^n$R ladder type resistor network circuits or other type circuits. The present invention includes D/A converters other than 8-bit D/A converters. It is possible to design the resistance values of the resistors 25 shown in FIG. 1 so that three of the four resistors 25 are the same as each other and the remaining resistor 25 has a resistance value different from those of the other resistors 25. It is also possible to use shift registers in the same way as the shift registers shown in FIG. 4. It is possible to employ, instead of the serial transfer shown in FIG. 4 or FIG. 6, a parallel transfer in order to write data into the registers.

The present invention is not limited to the specifically disclosed embodiments, and variations and modifications may be made without departing from the scope of the present invention.

What is claimed is:

1. A D/A converter comprising:
   D/A conversion means for converting a digital input signal into an analog output signal within an output voltage range and operating under a first reference voltage and a second reference voltage;
   varying means, connected to said D/A conversion means, for varying the first reference voltage in accordance with a first control data and for varying the second reference voltage, independently of the first reference voltage, in accordance with a second control data; and
   storing means, connected to said varying means, for storing the first and second control data, wherein a magnitude of the output voltage range is selectively varied in accordance with the first and second control data.

2. A D/A converter as claimed in claim 1, wherein:
   said D/A conversion means comprises:
   a resistor network including a plurality of resistors;
   first voltage setting means for generating a first voltage;
   second voltage setting means for generating a second voltage, said first and second voltages corresponding to said first and second control data; and
   switch means, coupled to said resistor network and said first and second voltage setting means, for selectively connecting said resistors in said resistor network to said first and second voltage setting means in accordance with said digital input signal, and
   wherein said varying means comprises means for controlling said first and second voltage setting means in accordance with said first and second reference voltages so that said first and second voltages are varied.

3. A D/A converter as claimed in claim 2, wherein:
   said first and second voltage setting means receives a first power supply voltage and a second power supply voltage;
   said first power supply voltage is equal to said first reference voltage; and
   said second power supply voltage is equal to said second reference voltage.

4. A D/A converter as claimed in claim 2, wherein:
   said first and second voltage setting means receives a first power supply voltage and a second power supply voltage;
   said first power supply voltage is different from said first reference voltage; and
   said second power supply voltage is different from said second reference voltage.

5. A D/A converter as claimed in claim 2, wherein said means for controlling said first and second voltage setting means comprises:
   voltage dividing means for dividing a difference between said first and second reference voltages into a plurality of divided voltages; and
   switch means, coupled to said voltage dividing means, for selecting desired divided voltages from said plurality of divided voltages in accordance with data supplied from an external device,
   said first and second voltage setting means respectively generates said first and second voltages from said desired divided voltages.

6. A D/A converter as claimed in claim 5, wherein:
   said first voltage setting means comprises a first operational amplifier having a first input terminal receiving one of said desired divided voltages, a second input terminal and a first output terminal connected to said second input terminal, said first voltage being output via said first output terminal;
   said second voltage setting means comprises a second operational amplifier having a third input terminal receiving one of said desired divided voltages, a fourth input terminal and a second output terminal connected to said fourth input terminal, said second voltage being output via said second output terminal.

7. A D/A converter as claimed in claim 6, wherein:
   said first operational amplifier comprises an enhancement type operational amplifier; and
   said second operational amplifier comprises a depletion type operational amplifier.

8. A D/A converter as claimed in claim 1, wherein said storing means comprises register means for storing data supplied from an external device.

9. A D/A converter as claimed in claim 1, wherein said D/A converter further comprises:
   a voltage-follower type operational amplifier receiving said analog output voltage and outputting an amplified analog output voltage; and
   select means, coupled to said voltage-follower type operational amplifier, said D/A conversion means and said storing means, for selecting either said analog output voltage from said D/A conversion means or said amplified analog output voltage in accordance with data supplied from an external device.

10. A D/A converter as claimed in claim 9, wherein said voltage-follower type operational amplifier comprises:
    amplifier means for amplifying said analog output signal; and
    output buffer means, coupled to said amplifier means, for buffering said analog output signal from said amplifier means, so that said amplified analog output signal is output by said output buffer means, and
    wherein:
    said varying means comprises gain setting means for generating a plurality of control voltages corresponding to different gains of said amplifier means; and said storing means comprises means for selecting one of said plurality of control voltages in accordance with said data supplied from the external device.

11. A D/A converter as claimed in claim 10, wherein:
said varying means comprises driving ability setting means for generating a plurality of control voltages corresponding to different driving abilities of said output buffer means; and
said setting control means comprises means for selecting one of said plurality of control voltages of said parameter setting means in accordance with said data supplied from the external device.

12. A D/A converter as claimed in claim 10, wherein:
said varying means comprises means for making said voltage-follower type operational amplifier inactive; and
said storing means comprises register means for storing data indicating whether or not said varying means should make said voltage-follower type operational amplifier inactive.

13. A D/A converter as claimed in claim 1, wherein said storing means comprises register means having storage areas respectively related to said first and second control data, for storing information respectively related to said first and second control data in said storage areas.

14. A D/A converter as claimed in claim 13, wherein said register means comprises a shift register.

15. A D/A converter device comprising:
a chip; and
a plurality of D/A converters formed on said chip, wherein each of said D/A converters includes:
D/A conversion means for converting a digital input signal into an analog output signal within an output voltage range and operating under a first reference voltage and a second reference voltage;
varying means, connected to said D/A conversion means, for varying the first reference voltage in accordance with a first control data and for varying the second reference voltage, independently of the first reference voltage, in accordance with a second control data; and
storing means, connected to said varying means, for storing the first and second control data, wherein a magnitude of the output voltage range is selectively varied in accordance with the first and second control data.

16. A D/A converter device as claimed in claim 15, wherein:
said D/A converter device comprises decoder means for selecting one of said D/A converters in accordance with an external select signal; and
said storing means comprises a plurality of registers respectively related to said D/A converters, for storing data supplied from an external device when said registers are individually selected by said decoder means.

17. A D/A converter device as claimed in claim 15, wherein:
said D/A converter device comprises decoder means for selecting one of said D/A converters in accordance with an external select signal; and
a plurality of registers respectively related to said D/A converters, for storing said digital input signal supplied from an external device when said registers are individually selected by said decoder means.

18. A D/A converter device as claimed in claim 15, wherein:
said D/A conversion means of each of said D/A converters comprises:
a resistor network including a plurality of resistors;
first voltage setting means for generating a first voltage;
second voltage setting means for generating a second voltage, said first and second voltages corresponding to said first and second control data; and
switch means, coupled to said resistor network and said first and second voltage setting means, for selectively connecting said resistors in said resistor network to said first and second voltage setting means in accordance with said digital input signal; and
wherein said varying means of each of said D/A converters comprises means for controlling said first and second voltage setting means in accordance with said first and second reference voltages so that said first and second voltages are varied.

19. A D/A converter device as claimed in claim 18, wherein said means for controlling said first and second voltage setting means of each of said D/A converters comprises:
voltage dividing means for dividing a difference between said first and second reference voltages into a plurality of divided voltages; and
switch means, coupled to said voltage dividing means, for selecting desired divided voltages from said plurality of divided voltages in accordance with data supplied from an external device,
said first and second voltage setting means respectively generates said first and second voltages from said desired divided voltages.

20. A D/A converter device as claimed in claim 19, wherein:
said first voltage setting means of each of said D/A converters comprises a first operational amplifier having a first input terminal receiving one of said desired divided voltages, a second input terminal and a first output terminal connected to said second input terminal, said first voltage being output via said first output terminal;
said second voltage setting means of each of said D/A converters comprises a second operational amplifier having a third input terminal receiving one of said desired divided voltages, a fourth input terminal and a second output terminal connected to said fourth input terminal, said second voltage being output via said second output terminal.

21. A D/A converter device as claimed in claim 20, wherein:
said first operational amplifier of each of said D/A converters comprises an enhancement type operational amplifier; and
said second operational amplifier of each of said D/A converters comprises a depletion type operational amplifier.

22. A D/A converter device as claimed in claim 18, wherein:
said first and second voltage setting means of each of said D/A converters receives a first power supply voltage and a second power supply voltage;
said first power supply voltage is equal to said first reference voltage; and said second power supply voltage is equal to said second reference voltage.

23. A D/A converter device as claimed in claim 18, wherein:
   said first and second voltage setting means of each of said D/A converters receives a first power supply voltage and a second power supply voltage;
   said first power supply voltage is different from said first reference voltage; and
   said second power supply voltage is different from said second reference voltage.

24. A D/A converter device as claimed in claim 15, wherein said storing means of each of said D/A converters comprises register means for storing data supplied from an external device.

25. A D/A converter device as claimed in claim 15, wherein each of said D/A converters further comprises:
   a voltage-follower type operational amplifier receiving said analog output voltage and outputting an amplified analog output voltage; and
   select means, coupled to said voltage-follower type operational amplifier, said D/A conversion means and said storing means, for selecting either said analog output voltage from said D/A conversion means or said amplified analog output voltage in accordance with data supplied from an external device.

26. A D/A converter device as claimed in claim 25, wherein said voltage-follower type operational amplifier of each of said D/A converters comprises:
   amplifier means for amplifying said analog output signal; and
   output buffer means, coupled to said amplifier means, for buffering said analog output signal from said amplifier means, so that said amplified analog output signal is output by said output buffer means, and
   wherein:
   said varying means of each of said D/A converters comprises gain setting means for generating a plurality of control voltages corresponding to different gains of said amplifier means; and
   said storing means comprises means for selecting one of said plurality of control voltages in accordance with said data supplied from the external device.

27. A D/A converter device as claimed in claim 26, wherein:
   said varying means of each of said D/A converters comprises driving ability setting means for generating a plurality of control voltages corresponding to different driving abilities of said output buffer means; and
   said storing means of each of said D/A converters comprises means for selecting one of said plurality of control voltages of said varying means in accordance with said data supplied from the external device.

28. A D/A converter device as claimed in claim 26, wherein:
   said varying means of each of said D/A converters comprises means for making said voltage-follower type operational amplifier inactive; and
   said storing means of each of said D/A converters comprises register means for storing data indicating whether or not said varying means should make said voltage-follower type operational amplifier inactive.

29. A D/A converter device as claimed in claim 15, wherein said storing means of each of said D/A converter comprises register means having storage areas respectively related to said first and second control data, for storing information respectively related to said first and second control data in said storage areas.

30. A D/A converter device as claimed in claim 29, wherein said register means of each of said D/A converters comprises a shift register.

* * * * *